US010680133B2

(12) United States Patent
Huang et al.

(10) Patent No.: US 10,680,133 B2
(45) Date of Patent: *Jun. 9, 2020

(54) LIGHT-EMITTING DEVICE AND MANUFACTURING METHOD THEREOF

(71) Applicant: EPISTAR CORPORATION, Hsinchu (TW)

(72) Inventors: Chien-Fu Huang, Hsinchu (TW); Chih-Chiang Lu, Hsinchu (TW); Chun-Yu Lin, Hsinchu (TW); Hsin-Chih Chiu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/436,544

(22) Filed: Jun. 10, 2019

(65) Prior Publication Data
US 2019/0296186 A1 Sep. 26, 2019

Related U.S. Application Data

(63) Continuation of application No. 15/944,459, filed on Apr. 3, 2018, now Pat. No. 10,319,877, which is a
(Continued)

(51) Int. Cl.
*H01L 33/02* (2010.01)
*H01L 21/66* (2006.01)
(Continued)

(52) U.S. Cl.
CPC .............. *H01L 33/02* (2013.01); *H01L 22/12* (2013.01); *H01L 22/14* (2013.01); *H01L 24/24* (2013.01);
(Continued)

(58) Field of Classification Search
CPC . H01L 25/0753; H01L 25/0657; H01L 25/50; H01L 27/156; H01L 24/95;
(Continued)

(56) References Cited

U.S. PATENT DOCUMENTS 5,573,975 A 11/1996 Cunningham et al.
6,872,635 B2 3/2005 Hayashi et al.
(Continued)

FOREIGN PATENT DOCUMENTS

| CN | 102509731 A1 | 6/2012 |
| TW | 201205772 A1 | 2/2012 |
| TW | 201306242 A1 | 2/2013 |
| TW | 201324843 A1 | 6/2013 |

* cited by examiner

*Primary Examiner* — Michael M Trinh
(74) *Attorney, Agent, or Firm* — Ditthavong & Steiner, P.C.

(57) ABSTRACT

The present disclosure provides a light-emitting device comprises a substrate with a topmost surface; a first semiconductor stack arranged on the substrate, and comprising a first light-emitting layer separated from the topmost surface by a first distance; a second semiconductor stack arranged on the substrate, and comprising a second light-emitting layer separated from the topmost surface by a second distance; and a third semiconductor stack arranged on the substrate, and comprising third light-emitting layer separated from the topmost surface by a third distance; wherein the first semiconductor stack, the second semiconductor stack, and the third semiconductor stack are configured to emit different color lights; and wherein the second distance is different form the first distance and the third distance.

11 Claims, 9 Drawing Sheets

Related U.S. Application Data continuation of application No. 15/609,795, filed on May 31, 2017, now abandoned, which is a continuation of application No. 14/901,415, filed as application No. PCT/CN2013/078051 on Jun. 26, 2013, now Pat. No. 9,705,029.

(51) Int. Cl.
*H01L 33/62* (2010.01)
*H01L 25/075* (2006.01)
*H01L 23/00* (2006.01)
*H01L 33/36* (2010.01)

(52) U.S. Cl.
CPC .......... *H01L 25/0753* (2013.01); *H01L 33/62* (2013.01); *H01L 33/36* (2013.01); *H01L 2924/0002* (2013.01); *H01L 2933/0033* (2013.01); *H01L 2933/0066* (2013.01)

(58) Field of Classification Search
CPC .......... H01L 22/12; H01L 22/14; H01L 33/02; H01L 33/62; H01L 33/36; H01L 33/0079; H01L 33/48
See application file for complete search history.

(56) References Cited

U.S. PATENT DOCUMENTS

| | | | |
|---|---|---|---|
| 7,005,679 B2 | 2/2006 | Tarsa et al. | |
| 8,072,063 B2 | 12/2011 | Chuang et al. | |
| 8,337,071 B2 * | 12/2012 | Negley | F21S 8/02 362/648 |
| 8,384,114 B2 | 2/2013 | Tischler et al. | |
| 8,643,029 B2 | 2/2014 | Lee et al. | |
| 10,319,877 B2 * | 6/2019 | Huang | H01L 22/12 |
| 2005/0023304 A1 | 2/2005 | Vogel et al. | |
| 2006/0256826 A1 * | 11/2006 | Lin | H01L 25/0753 372/43.01 |
| 2007/0200115 A1 | 8/2007 | Das et al. | |
| 2010/0237379 A1 | 9/2010 | Kuo et al. | |
| 2010/0259164 A1 * | 10/2010 | Oohata | H01L 25/0753 313/505 |
| 2012/0146066 A1 | 6/2012 | Tischler et al. | |
| 2013/0026511 A1 * | 1/2013 | Yeh | H01L 25/0753 257/89 |
| 2013/0140994 A1 | 6/2013 | Rhodehouse | |
| 2013/0206242 A1 | 8/2013 | Hurst | |
| 2013/0328172 A1 | 12/2013 | Tischler | |

(a)

(b)

LIGHT-EMITTING DEVICE AND MANUFACTURING METHOD THEREOF

CROSS REFERENCE TO RELATED APPLICATIONS

This application a continuation application of U.S. patent application, Ser. No. 15/944,459, filed on Apr. 3, 2018, which is a continuation application of U.S. patent application Ser. No. 15/609,795, filed on May 31, 2017, which is a continuation application of U.S. patent application Ser. No. 14/901,415, now U.S. Pat. No. 9,705,029, filed on Dec. 28, 2015, which claims the right of priority based on PCT application Ser. No. PCT/CN2013/078051 filed on Jun. 26, 2013; the content of which is incorporated herein by reference in its entirety.

FIELD OF DISCLOSURE

The present disclosure relates to a light-emitting device and manufacturing method thereof, in particular to a light-emitting device having a plurality of blocks of semiconductor stack and manufacturing method thereof.

BACKGROUND OF THE DISCLOSURE

A light-emitting diode (LED) is suitable for various lighting and display applications because it has good opto-electrical characteristics of low power consumption, low heat generation, long life, shock tolerance, compact, and swift response. A multi-cell light-emitting device is a device composed of multiple light-emitting diodes, such as an array of light-emitting diodes. With the development of technology in applications, a multi-cell light-emitting device has a wider application in the market, for example, an optical display device, a traffic light, and a lighting apparatus. A lighting device of a High Voltage LED (HV LED) is one of the examples.

As shown in FIGS. 7A and 7B, a conventional array of light-emitting diodes 1 includes a substrate 10, a plurality of light-emitting diode units 12 arranged in two-dimension on the substrate 10, wherein each of the light-emitting diode units 12 includes a light-emitting stack comprising a p-type semiconductor layer 121, a light-emitting layer 122, and an n-type semiconductor layer 123. These light-emitting diode units 12 are formed by patterning a light-emitting stack with an etching process to form trenches 14 by which the light-emitting diode units 12 are defined. Since the substrate 10 is not conductive, trenches 14 formed between the plurality of the light-emitting diode units 12 make the light-emitting diode unit 12 electrically insulated from each other. Further, the light-emitting diode units 12 are partially etched to expose the n-type semiconductor layer 123, and a first electrode 18 and a second electrode 16 are respectively formed on the exposed region of the n-type semiconductor layer 123 and a p-type semiconductor layer 121. Then based on a circuit design, conductive wiring structures 19 are used to form connection between the plurality of light-emitting diode units 12, the first electrode 18, and the second electrode 16, and the plurality of light-emitting diode units 12 is electrically connected in series or in parallel. For example, if a serial circuit is formed, a Direct Current (DC) High Voltage LED (HV LED) is formed.

Nevertheless, a device formed by this process often has a decreased overall luminous intensity because of the light absorption between the light-emitting diode units 12. In addition, for a device formed by this process, the light-emitting diode units 12 are formed by patterning a light-emitting stack with an etching process to form the trenches 14 by which the light-emitting diode units 12 are defined. Therefore, different devices includes different light-emitting diode units 12 from different parts of the substrate, and there is a poor uniformity between devices on optical characteristics or electrical characteristics.

SUMMARY OF THE DISCLOSURE

The present disclosure provides a light-emitting device comprises a substrate with a topmost surface; a first semiconductor stack arranged on the substrate, and comprising a first light-emitting layer separated from the topmost surface by a first distance; a second semiconductor stack arranged on the substrate, and comprising a second light-emitting layer separated from the topmost surface by a second distance; and a third semiconductor stack arranged on the substrate, and comprising third light-emitting layer separated from the topmost surface by a third distance; wherein the first semiconductor stack, the second semiconductor stack, and the third semiconductor stack are configured to emit different color lights; and wherein the second distance is different form the first distance and the third distance.

DETAILED DESCRIPTION OF THE DISCLOSURE

Figure 1:
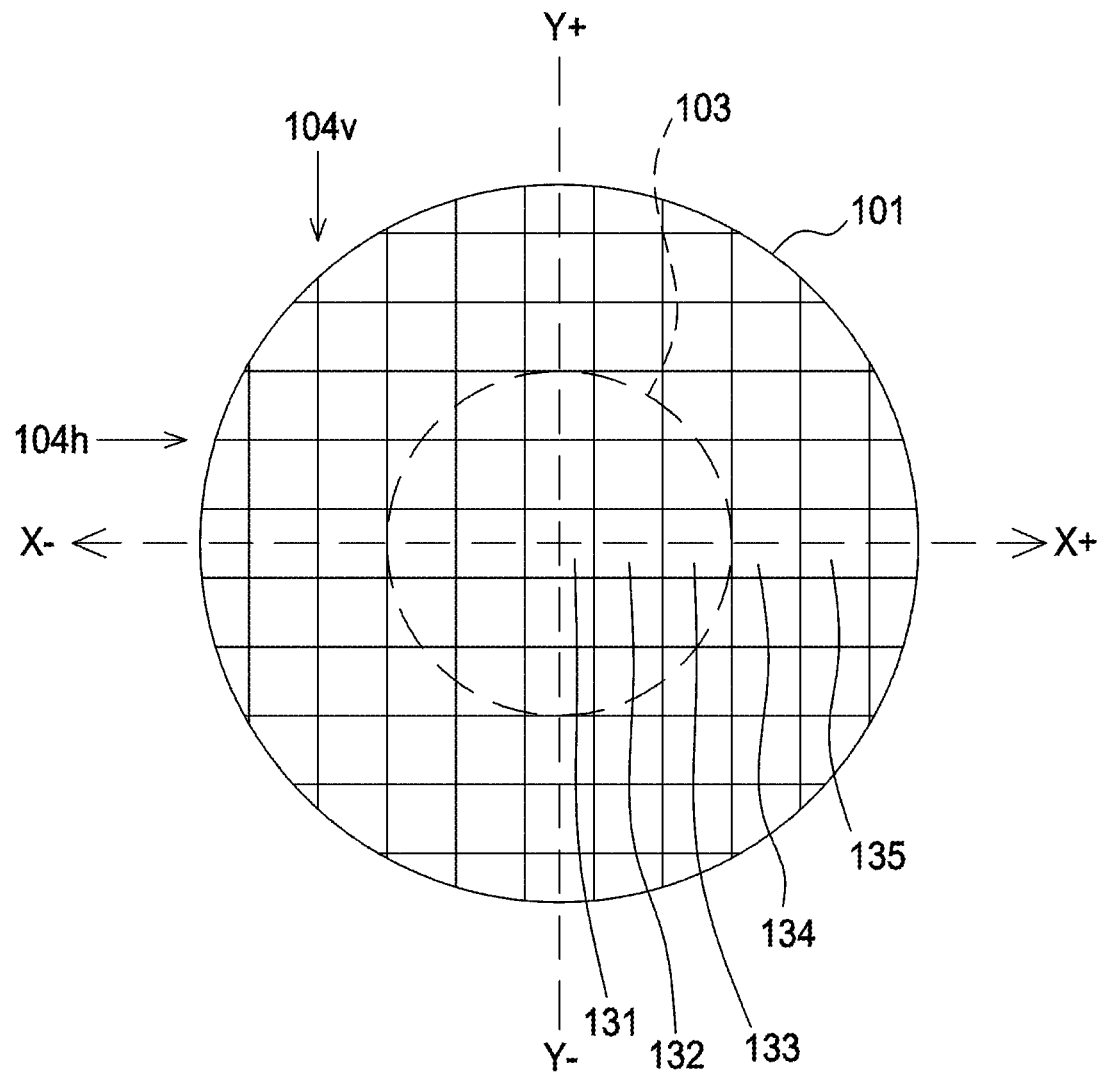
FIG. 1 shows a top view of a substrate used in a manufacturing method of a light-emitting device in accordance with an embodiment of the present disclosure.

FIG. 1 shows a top view of a substrate used in a manufacturing method of a light-emitting device in accordance with an embodiment of the present disclosure. There are a plurality of blocks of semiconductor stack on the substrate 101, such as blocks of semiconductor stack 131, 132, 133, 134 and 135. These blocks of semiconductor stack are formed by patterning a semiconductor stack (not shown), wherein patterning means a process performed on the semiconductor stack covered with a photo-resist and then subject to exposure, development, and then etching to form patterns. After patterning, a plurality of trenches 104v, 104h are formed, and the semiconductor stack is divided by the trenches 104v, 104h into the aforementioned plurality of blocks of semiconductor stack. However, the method for patterning is not limited to this process. There are other methods, for example, a direct cutting by laser. Further, the aforementioned semiconductor stack can be grown on the substrate 101. That is, the substrate 101 is a growth substrate for the semiconductor stack. In another embodiment, the semiconductor stacked is formed on another growth substrate, and then the semiconductor stack is transferred to the substrate 101 with a transfer technique. In this case, there may be further an adhesive layer (not shown) between the semiconductor stack (or the block of semiconductor stack) and the substrate 101. The transfer technique is well known to a person having ordinary skill in the art, and therefore is not illustrated here.

It is noted that, in the present embodiment, the plurality of blocks of semiconductor stack may have different optical characteristics or electrical characteristics, and an optical characteristic value or an electrical characteristic value for each block of semiconductor stack can be measured by a measurement step. Based on a predetermined differential value for the optical characteristic value or the electrical characteristic value, the blocks of semiconductor stack are classified into being located in a first region or a second region on the substrate 101. The optical characteristic values, for example, are a luminous intensity or a wavelength, and the wavelength can be a dominant wavelength or a peak wavelength. The electrical characteristic value, for example, is a forward voltage. In the present embodiment, after measuring the luminous intensity of each of blocks of semiconductor stack, according to a predetermined differential value for the luminous intensity, the blocks of semiconductor stack are classified into being in a first region or a second region on the substrate 101. In the present embodiment, the predetermined differential value for the luminous intensity is a difference greater than or equal to 3%. Based on this, a result of the classification is that the first region is substantially a circle, as a circular area surrounded by a circular borderline 103 shown in the figure, and the second region is an annular shape surrounding the first region, as the annular shape outside the circular borderline 103 shown in the figure. The blocks of semiconductor stack in the first region have close values in the luminous intensity, and the blocks of semiconductor stack in the second region have close values in the luminous intensity. In the present embodiment, the blocks of semiconductor stack in the first region, such as the blocks of semiconductor stack 131, 132, and 133, have an average luminous intensity of 4400 mcd, and a standard deviation for the luminous intensity values of the blocks of semiconductor stack in this region is about 0.5~1.5 mcd. Meanwhile, the blocks of semiconductor stack in the second region, such as the blocks of semiconductor stack 134 and 135, have an average luminous intensity of 4000 mcd, and a standard deviation for the luminous intensity values of the blocks of semiconductor stack in this region is about 0.5~1.5 mcd. The differential value for the luminous intensity values between the blocks of semiconductor stack in the first region and the second region is about 10% ((4400−4000)/4000=10%), which is greater than or equal to 3%.

Figure 6:
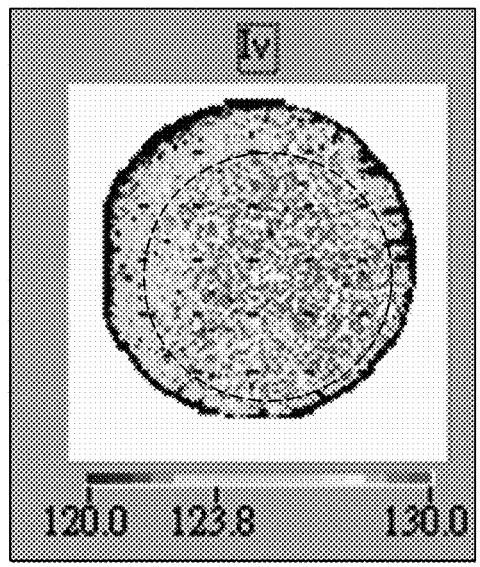
FIG. 6 shows a distribution from an actual measurement result of a substrate used in a manufacturing method of a light-emitting device in accordance with an embodiment of the present disclosure. Part (a) illustrates determination of a first region and a second region based on a measurement result of the luminous intensity values; Part (b) illustrates determination of a first region and a second region based on a measurement result of a dominant wavelength.
Figure 6:
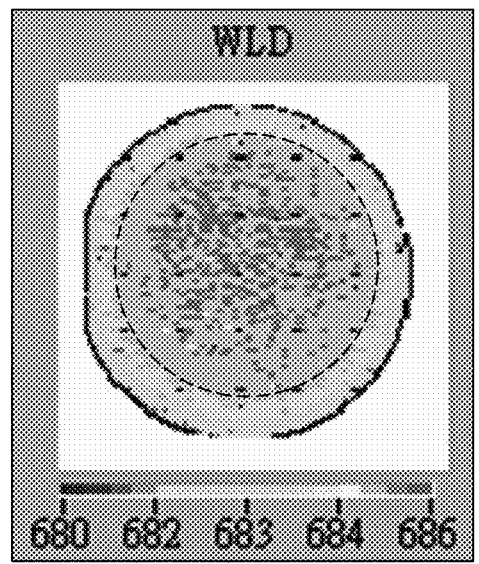
Figure 7A:
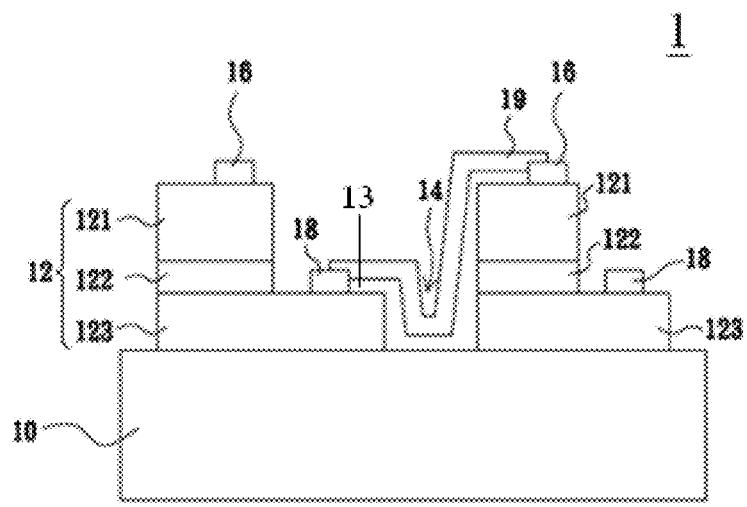
FIGS. 7A and 7B show a conventional array of light-emitting diodes.
Figure 7B:
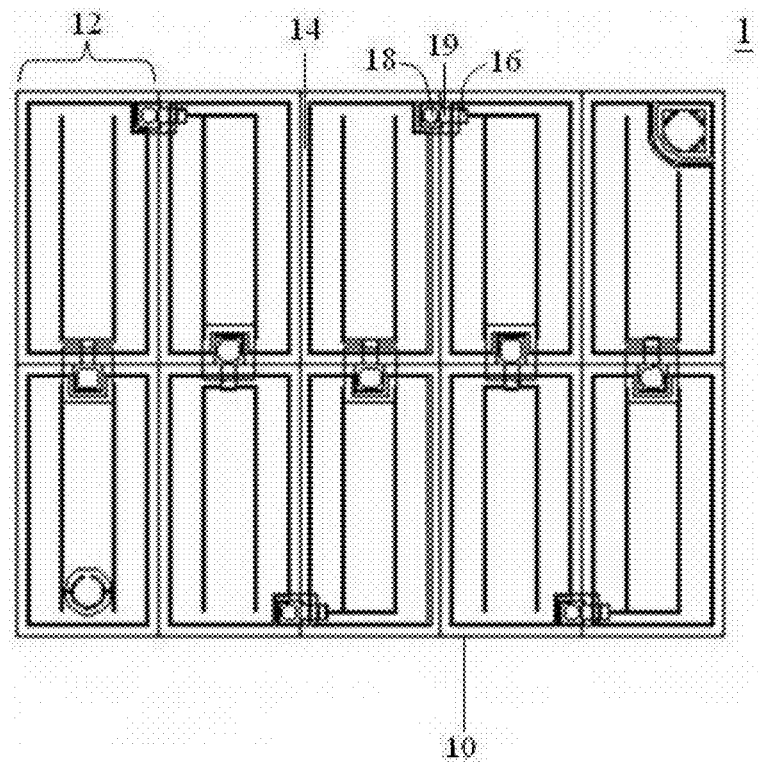

In addition to the luminous intensity, in other embodiments, the difference in optical characteristics to distinguish the first region and second region may be a difference in a peak wavelength or a dominant wavelength which is greater than or equal to 1 nm. And the difference in electrical characteristics may be a difference in a forward voltage which is greater than or equal to 2%. FIG. 6 shows a distribution from an actual measurement result. Part (a) illustrates a classification based on a measurement result of the luminous intensity values, wherein a first region and a second region are determined based on the predetermined differential value for the luminous intensity. In the present embodiment, the predetermined differential value for the luminous intensity is a differential value greater than or equal to 3%. As shown in part (a), the luminous intensity measured for each of the blocks of semiconductor stack is indicated by a color (gray scale in the figure). For different colors (gray scales in the figure), a luminous intensity value can be found by referring to an indication below which shows a relationship between the luminous intensity value and the color. As enclosed by the dashed circle in the figure, the first region includes mainly red and orange colors (both gray scales in the figure), wherein the red color represents a luminous intensity of 130 mcd, and the orange color represents a luminous intensity of 129 mcd. Only a few of blocks of semiconductor stack inside the dashed circle are in green color (gray scale in the figure) which represents a luminous intensity of 124 mcd. The first region is substantially in a circular shape, with an average luminous intensity of about 129 mcd. The second region is substantially an annular shape surrounding the first region described above, and includes mainly blocks of semiconductor stack in a green color (gray scale in the figure) which represents a luminous intensity of 124 mcd. Only a few of blocks of semiconductor stack inside the second region are in red color (gray scale in the figure) which represents a luminous intensity of 130 mcd, and in orange color (gray scale in the figure) which represents a luminous intensity of 129 mcd. An average luminous intensity of the second region is about 124 mcd. That is, the average luminous intensity of the first region is greater than the average luminous intensity of the second region, by a differential value of about 4% ((129−124)/124=4%), which is greater than or equal to 3%. Part (b) illustrates a classification based on a measurement result of a dominant wavelength (WLD), wherein a first region and a second region are determined based on the predetermined differential value for the dominant wavelength. In the present embodiment, the predetermined differential value for the dominant wavelength is a differential value greater than or equal to 1 nm. As shown in part (b), the first region (as enclosed by the dashed circle in the figure) is substantially in a circular shape, with an average dominant wavelength of about 685 nm. The second region is substantially an annular shape surrounding the first region above, with an average dominant wavelength of about 683 nm. An average dominant wavelength of the first region is greater than the average dominant wavelength of the second region, by a differential value of about 2 nm, which is greater than a predetermined differential value for the dominant wavelength of 1 nm.

Figure 2A:
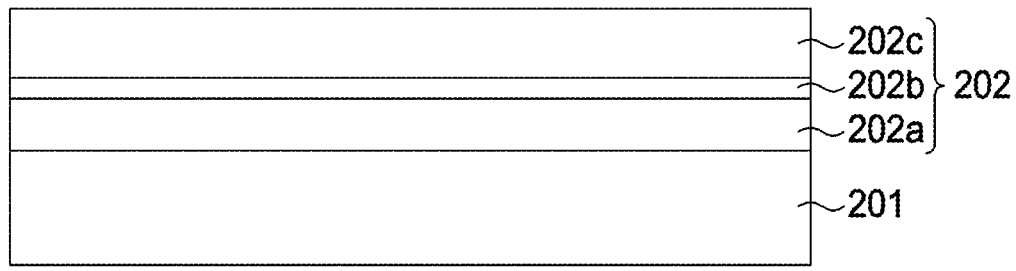
FIGS. 2A to 2E show a separating method for the manufacturing method of the light-emitting device in accordance with one embodiment of the present disclosure.
Figure 2B:
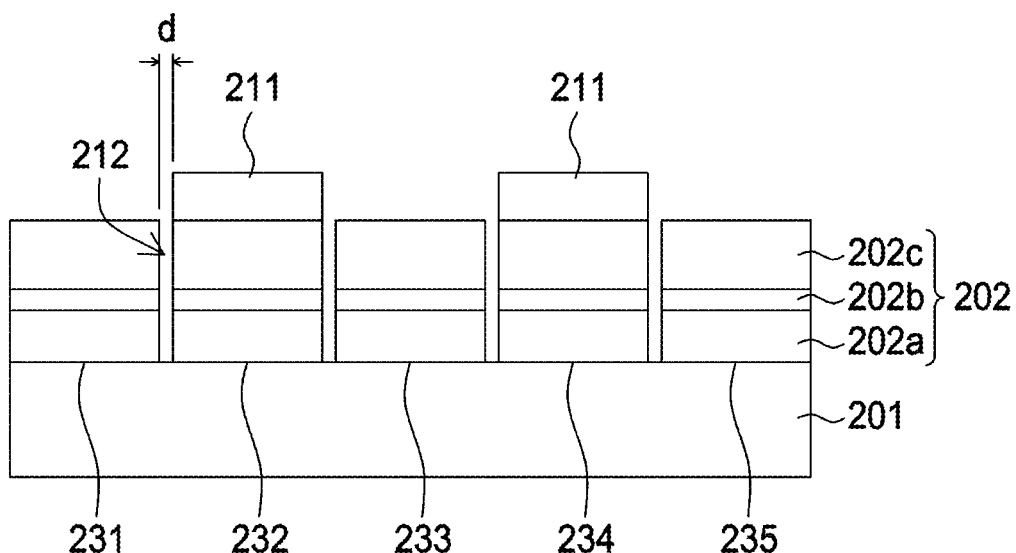
Figure 2C:
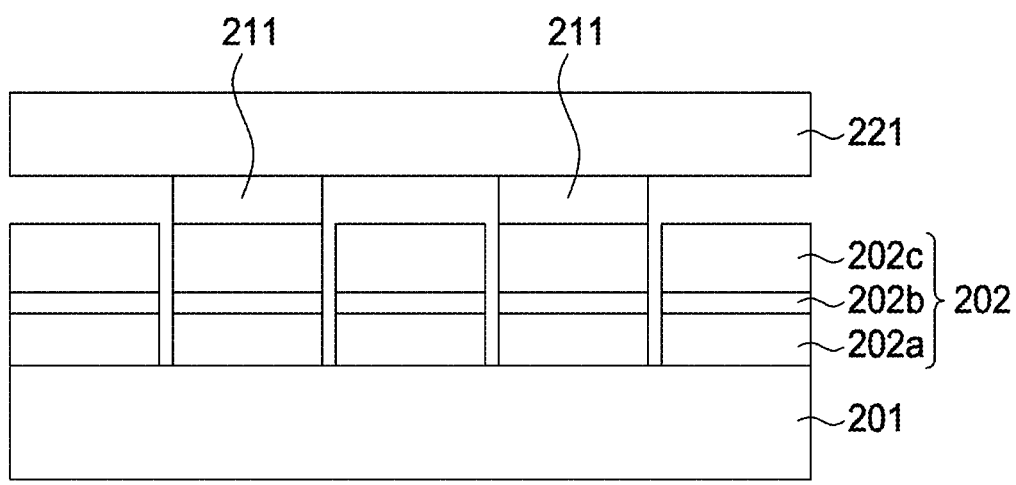
Figure 2D:
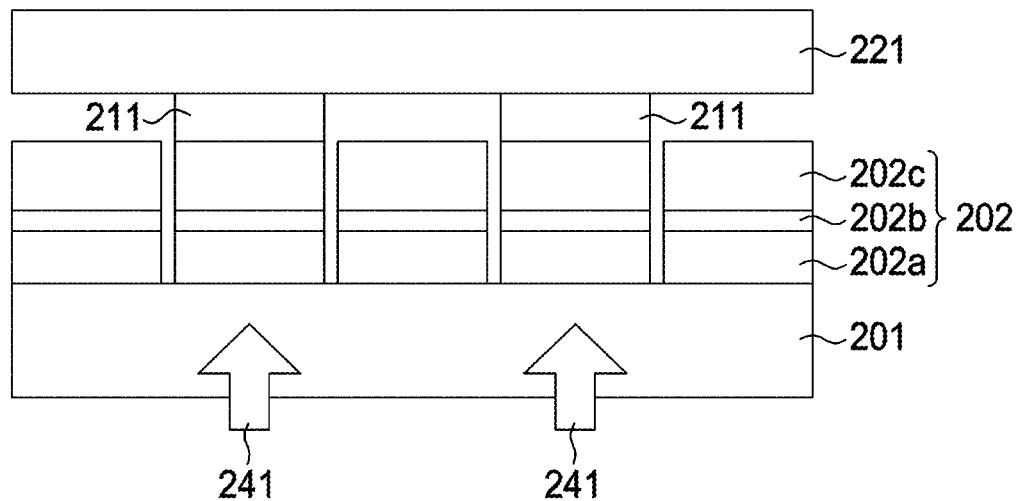

FIGS. 2A-2E show a separating method for the manufacturing method of the light-emitting device in accordance with one embodiment of the present disclosure. As mentioned in the FIG. 1, a semiconductor stack 202 is on a substrate 201 as shown in FIG. 2A, wherein the semiconductor stack 202 includes a first conductive type semiconductor layer 202a, a light-emitting layer 202b on the first conductive type semiconductor layer 202a, and a second conductive type semiconductor layer 202c on the light-emitting layer 202b. The first conductive type semiconductor layer 202a and the second conductive type semiconductor layer 202c are of different conductive type. For example, the first conductive type semiconductor layer 202a is n-type semiconductor layer, and the second conductive type semiconductor layer 202c is p-type semiconductor layer. The first conductive type semiconductor layer 202a, the light-emitting layer 202b, and the second conductive type semiconductor layer 202c include III-V group material, such as AlGaInP series materials or AlGaInN series materials. As shown in FIG. 2B, after performing the aforementioned patterning step, a plurality of the trenches 212 having a width d is formed, and the semiconductor stack 202 is patterned into a plurality of blocks of semiconductor stack 231, 232, 233, 234 and 235, which are respectively corresponding to blocks of semiconductor stack 131, 132, 133, 134 and 135 in FIG. 1, and have the luminous intensity values as illustrated in FIG. 1, and therefore are classified to the first region or the second region accordingly. That is, blocks of semiconductor stack 231, 232, and 233 are in the first region illustrated in FIG. 1, and have the luminous intensity values of 4400 mcd. The blocks of semiconductor stack 234 and 235 are in the second region illustrated in FIG. 1, and have the luminous intensity values of 4000 mcd. There is a difference greater than 3% in luminous intensity between the blocks of semiconductor stack 231, 232, and 233, and the blocks of semiconductor stack 234 and 235. And then, to facilitate a separating step, a first sacrificial layer 211 is formed on the blocks of semiconductor stack which are to be removed. In this embodiment, the blocks of semiconductor stack 232 and 234 are to be removed. The first sacrificial layer 211 may be formed by forming a layer for the first sacrificial layer 211 on the whole surface of the substrate 201, and then selectively leaving the first sacrificial layer 211 on the blocks of semiconductor stack 232 and 234 which are to be removed by lithography and etching process. It is noted that, the person having ordinary skill in the art realizes the order for the above-mentioned processes may be altered. That is, the process to form the first sacrificial layer 211 on the blocks of semiconductor stack 232 and 234 which are to be removed is performed first, and then the aforementioned patterning process is carried out by a lithography and etching process to pattern the semiconductor stack 202 into the plurality of blocks of semiconductor stack 231, 232, 233, 234 and 235. FIG. 2C shows the separating step which includes providing a first temporary substrate 221 is performed, and the first temporary substrate 221 and the first sacrificial layer 211 are bonded together. And then, as shown in FIG. 2D, the blocks of semiconductor stack 232 and 234 which are to be removed are separated from the substrate 201. During this process, a laser may be irradiated at an interface between the blocks of semiconductor stack 232 and 234 which are to be removed and the substrate 201 for facilitating the separation. Further, the semiconductor stack 202 may be formed in advance on other growth substrate and then transferred to the substrate 201 by a transferring technique. In this case, when transferring the semiconductor stack 202 to the substrate 201, a sacrificial layer (not shown) may be selectively formed in advance on positions of the blocks of semiconductor stack 232 and 234 which are to be removed. The sacrificial layer is a fragile material or has a weak adhesion to the substrate 201, so that the blocks of semiconductor stack 232 and 234 which are to be removed can be separated from the substrate 201 more easily during the separating process.

Figure 2E:
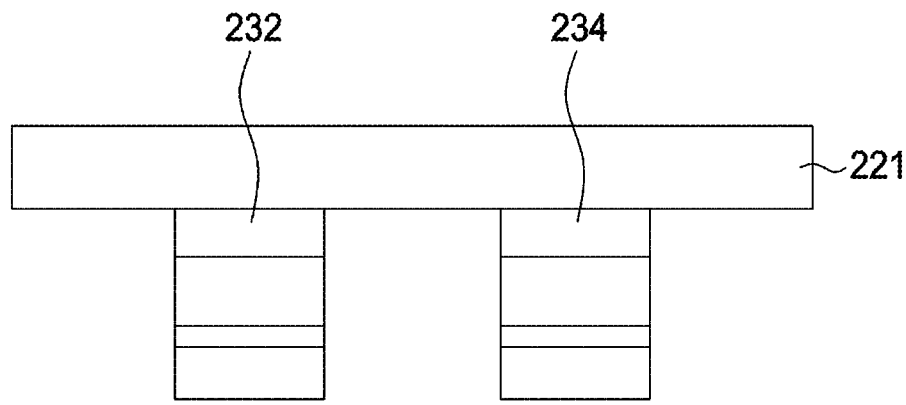
Figure 2E:
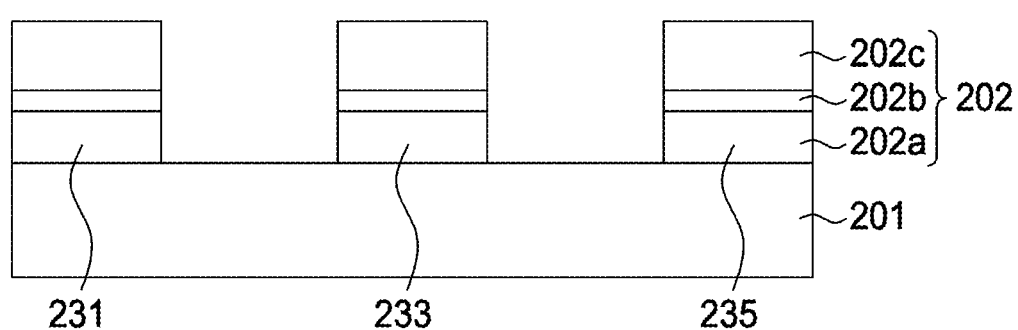

FIG. 2E shows the status after the separating process. The blocks of semiconductor stack 232 and 234 are separated from the substrate 201, while the blocks of semiconductor stack 231, 233, and 235 are kept remained on the substrate 201. It is noted that, both of the first temporary substrate 221 and the blocks of semiconductor stack 232 and 234 thereon, and the substrate 201 and the blocks of semiconductor stack 231, 233, and 235 thereon can be used in the manufacturing methods for the light-emitting device in the following embodiments.

Figure 3A:
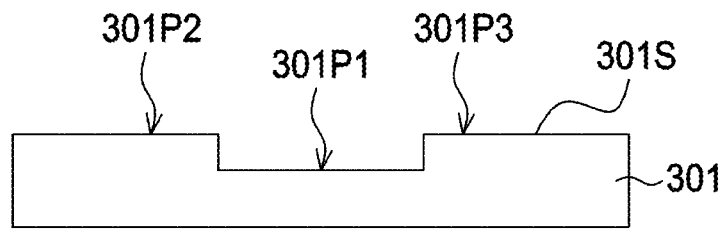
FIGS. 3A to 3E show a manufacturing method of a light-emitting device in accordance with the first embodiment of the present disclosure.

FIGS. 3A to 3E show a manufacturing method for a light-emitting device in accordance with a first embodiment of the present disclosure. As shown in FIG. 3A, a permanent substrate 301 is provided first, wherein this permanent substrate 301 has a first surface 301P1 and a second surface 301P2. In the present embodiment, the permanent substrate 301 further has a third surface 301P3. As shown in the figure, the first surface 301P1 and the second surface 301P2 are non-coplanar. In one embodiment, this non-coplanar situation is caused by lithography and etching processes applied to a permanent substrate which originally has a flat surface. The material for the permanent substrate 301 may be glass, sapphire ($Al_2O_3$), or silicon (Si) substrate.

Figure 3B:
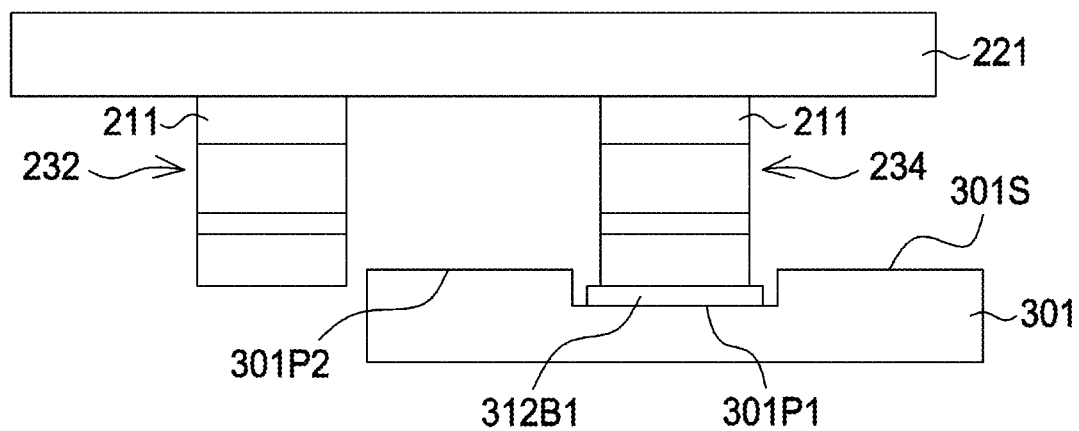
Figure 3C:
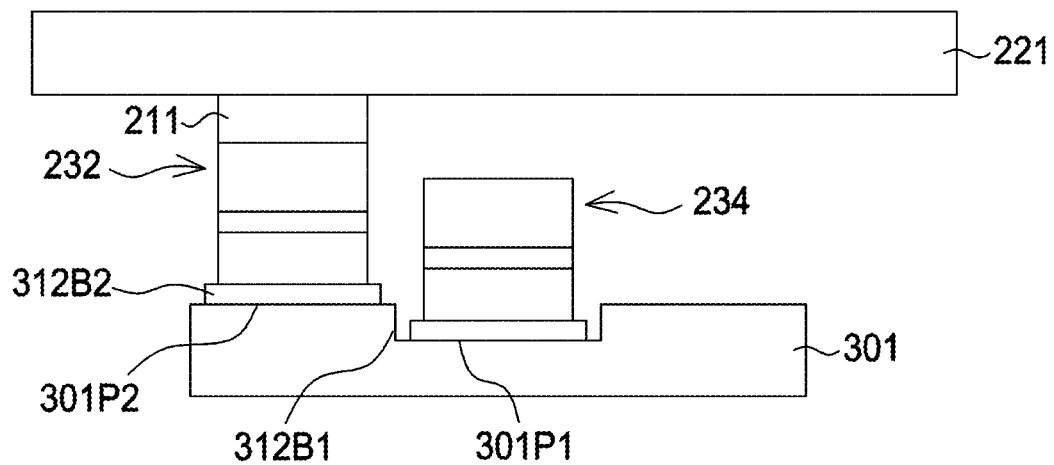

Subsequently, as shown in FIG. 3B, the block of semiconductor stack 234 in FIG. 2E is bonded to the first surface 301P1 of the permanent substrate 301. For example, when the material of the permanent substrate 301 is a sapphire substrate, the block of semiconductor stack 234 can be directly bonded to the permanent substrate 301 under appropriate temperature and pressure, such as a temperature of about 300° C.~420° C., and a pressure of about 11000 Kgf~14000 Kgf. The bonding can also be carried out optionally with a bonding layer 312B1. For example, when the material of the permanent substrate 301 is sapphire, silicon dioxide can be used as the bonding layer 312B1. The block of semiconductor stack 234 is then separated from the first temporary substrate 221. During this process, a laser (not shown) is used to irradiate at an interface between the block of semiconductor stack 234 and the first sacrificial layer 211 for facilitating the separation.

Then, as shown in FIG. 3 C, the block of semiconductor stack 232 is bonded to the second surface 301P2 of the permanent substrate 301. This bonding is substantially similar to the bonding of the block of semiconductor stack 234 illustrated above, and therefore is not illustrated again.

As described in FIG. 2A, in one embodiment, blocks of semiconductor stack 231, 232, 233, 234, and 235 are respectively corresponding to blocks of semiconductor stack 131, 132, 133, 134 and 135 in FIG. 1, and have the luminous intensity values as illustrated in FIG. 1. That is, blocks of semiconductor stack 231, 232, and 233 are in the first region illustrated in FIG. 1, and have the luminous intensity values of 4400 mcd. The blocks of semiconductor stack 234 and 235 are in the second region illustrated in FIG. 1, and have the luminous intensity values of 4000 mcd. There is a difference greater than 3% in luminous intensity between the blocks of semiconductor stack 231, 232, and 233, and the blocks of semiconductor stack 234 and 235. By using the manufacturing method in the above embodiment, a light-emitting device can be formed with a rearrangement or a reallocation of blocks of semiconductor stack located originally in two regions which have great difference in optical characteristics or electrical characteristics. For example, when a conventional manufacturing method in the background is used, blocks of semiconductor stack 132 and 133 may be combined to form a device (device A) because of their close locations and being substantially in the same region (Please refer to FIG. 1 and FIG. 2B). Similarly, blocks of semiconductor stack 134 and 135 may be combined to form another device (device B) because of their close locations and being substantially in the same region (Please refer to FIG. 1 and FIG. 2B). Therefore, device A includes two blocks of semiconductor stack which have an average luminous intensity of 4400 mcd, while device B includes two blocks of semiconductor stack which have an average luminous intensity of 4000 mcd. The uniformity of luminous intensity for these two devices is poor. In contrast, for a light-emitting device formed by using the manufacturing method in the above embodiment, such as the one shown in FIG. 3C, there is a block of semiconductor stack 234 on the first surface 301P1, while there is a block of semiconductor stack 232 on the second surface 301P2, wherein the block of semiconductor stack 234 is originally located in the second region in FIG. 1 which has an average luminous intensity of 4000 mcd, while the block of semiconductor stack 232 is originally located in the first region in FIG. 1 which has an average luminous intensity of 4400 mcd. That is, blocks of semiconductor stack originally located in two regions which have great difference in optical characteristics or electrical characteristics are rearranged or reallocated to form a combination. Similarly, by using the manufacturing method in the above embodiment, another device which includes the block of semiconductor stack 235 and the block of semiconductor stack 233 can be formed, wherein the block of semiconductor stack 235 is originally located in the second region in FIG. 1 which has an average luminous intensity of 4000 mcd, while the block of semiconductor stack 233 is originally located in the first region in FIG. 1 which has an average luminous intensity of 4400 mcd. There is a better performance for the uniformity of luminous intensity for these two devices above.

In addition, by bonding to the permanently substrate 301, the blocks of semiconductor stack 234 and 232 are located respectively on two non-coplanar surfaces, that is, the first surface 301P1 and the second surface 301P2. This reduces the mutual absorption of light between the blocks of semiconductor stack, and leads to a better performance on an overall luminous intensity.

Figure 3D:
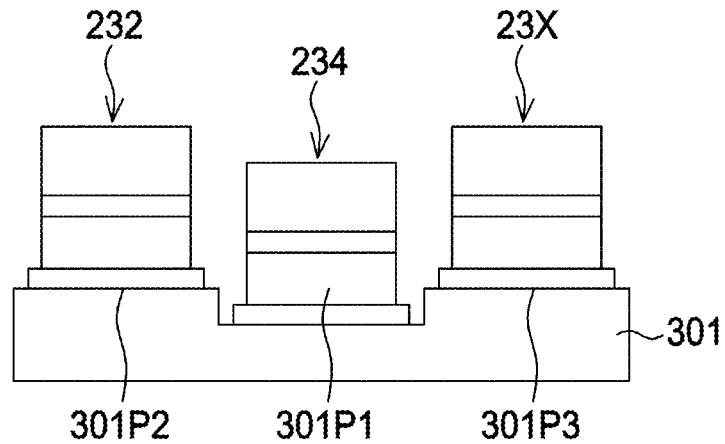
Figure 3E:
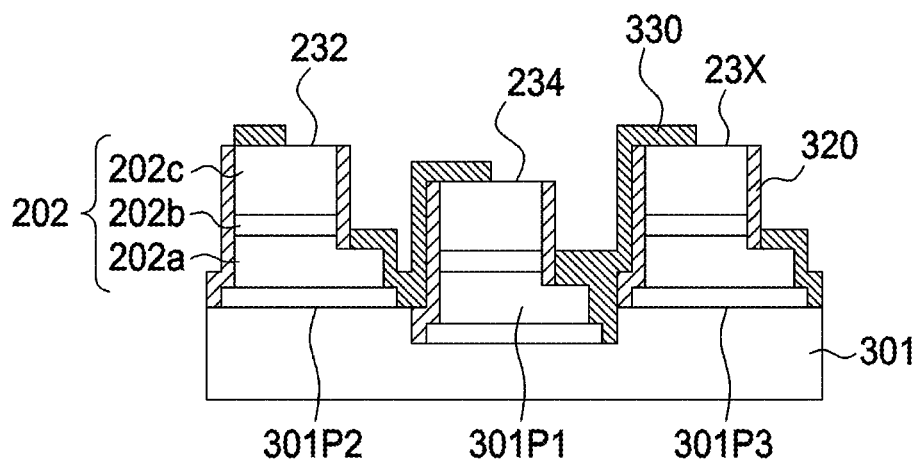

By using the aforementioned bonding method, another block of semiconductor stack 23X can be bonded to the third surface 301P3, as shown in FIG. 3D. There is no particular limitation for the block of semiconductor stack 23X. For the person having ordinary skill in the art, what is important is to rearrange or reallocate blocks of semiconductor stack to form a combination to produce a device which has a better performance on the uniformity in optical characteristics or electrical characteristics. Subsequently, as shown in FIG. 3E, the blocks of semiconductor stack are partially etched to expose their first conductive type semiconductor layer 202a by using lithography and etching processes, and a dielectric layer 320 is formed on sidewalls of the blocks of semiconductor stack. A metal line 330 is formed between the blocks of semiconductor stack to electrically connect the blocks of semiconductor stack in a serial or parallel connection. As shown in FIG. 3E, the metal line 330 electrically connects the blocks of semiconductor stack in a serial connection.

Although in this embodiment all the two blocks of semiconductor stack bonded to the permanent substrate 301 are selected from the blocks of semiconductor stack separated from the substrate 201 as shown in FIG. 2E, the person having ordinary skill in the art understands this is not a limitation. For example, the blocks of semiconductor stack 231, 233, and 235 are kept remained on the substrate 201, and in a second embodiment it can be these blocks of semiconductor stack which are kept remained on the substrate 201 that are bonded to the permanent substrate 301. This embodiment is substantially the same as those illustrated in FIGS. 3B to 3E, and can be realized simply by correspondently substituting the first temporary substrate 221 and the blocks of semiconductor stack thereon in these figures with the substrate 201 and the blocks of semiconductor stack 231, 233, and 235 thereon. Therefore, the figures for this embodiment are not presented in the specification. In this embodiment, the bonding process is an alignment bonding of the substrate 201 to the permanent substrate 301, so that the blocks of semiconductor stack 231, 233, and 235 are respectively bonded to surfaces which they are intended to be bonded. And then the substrate 201 is moved away from the permanent substrate 301, so that the blocks of semiconductor stack which are bonded are separated from the substrate 201. In the third embodiment, the blocks of semiconductor stack 231, 233, and 235 which are kept remained on the substrate 201 can be first separated from the substrate 201 as illustrated in the first embodiment, and then bonded to the permanent substrate 301. In this case, the bonding process is to bond the blocks of semiconductor stack 231, 233, and 235 to a second temporary substrate. After the bonding process, the blocks of semiconductor stack 231, 233, and 235 are separated from the substrate 201. And then an alignment bonding of the second temporary substrate to the permanent substrate 301 is performed so that the blocks of semiconductor stack 231, 233, and 235 are respectively bonded to surfaces which they are intended to be bonded. And then the second temporary substrate is moved away from the permanent substrate 301 so that the blocks of semiconductor stack which are bonded are separated from the second temporary substrate.

Although the first embodiment illustrates the block of semiconductor stack (i.e., the block of semiconductor stack 234) on the first surface 301P1 of the permanent substrate 301, and the block of semiconductor stack (i.e., the block of semiconductor stack 232) on the second surface 301P2 of the permanent substrate 301 are both from the same semiconductor stack 202, this is not a limitation. That is, in other embodiment, the block of semiconductor stack on the first surface 301P1 and the block of semiconductor stack on the second surface 301P2 can be from different semiconductor stacks. Further, even in the case that the blocks of semiconductor stack are from the same semiconductor stack, they can be bonded to the permanent substrate 301 through the first temporary substrate 221, the substrate 201, or the second temporary substrate as illustrated respectively in the foregoing embodiments.

Figure 3F:
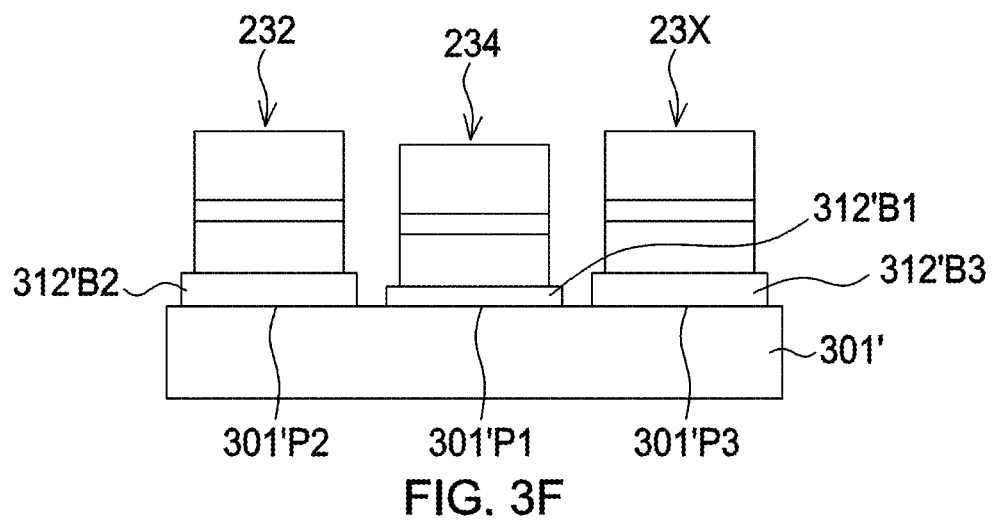
FIG. 3F shows a manufacturing method of a light-emitting device in accordance with the fourth embodiment of the present disclosure.

FIG. 3F shows the fourth embodiment of the present disclosure. This embodiment is substantially the same as the first embodiment, but the permanent substrate 301 in the first embodiment is substituted by another permanent substrate 301'. In contrast to the permanent substrate 301 comprising the first surface 301P1, the second surface 301P2, and the third surface 301P3 which are non-coplanar, the permanent substrate 301' in this embodiment includes a first surface 301'P1, a second surface 301'P2, and a third surface 301'P3 which are coplanar. But when the blocks of semiconductor stack are bonded to the permanent substrate 301', they are non-coplanar because bonding layers of different thicknesses are used. For example, the block of semiconductor stack 234 is bonded to the first surface 301'P1 with a first bonding layer 312'B1, while the block of semiconductor stack 232 is bonded to the second surface 301'P2 with a second bonding layer 312'B2. The first bonding layer 312'B1 and the second bonding layer 312'B2 have different thicknesses so that the block of semiconductor stack 234 and the block of semiconductor stack 232 are non-coplanar.

Figure 4:
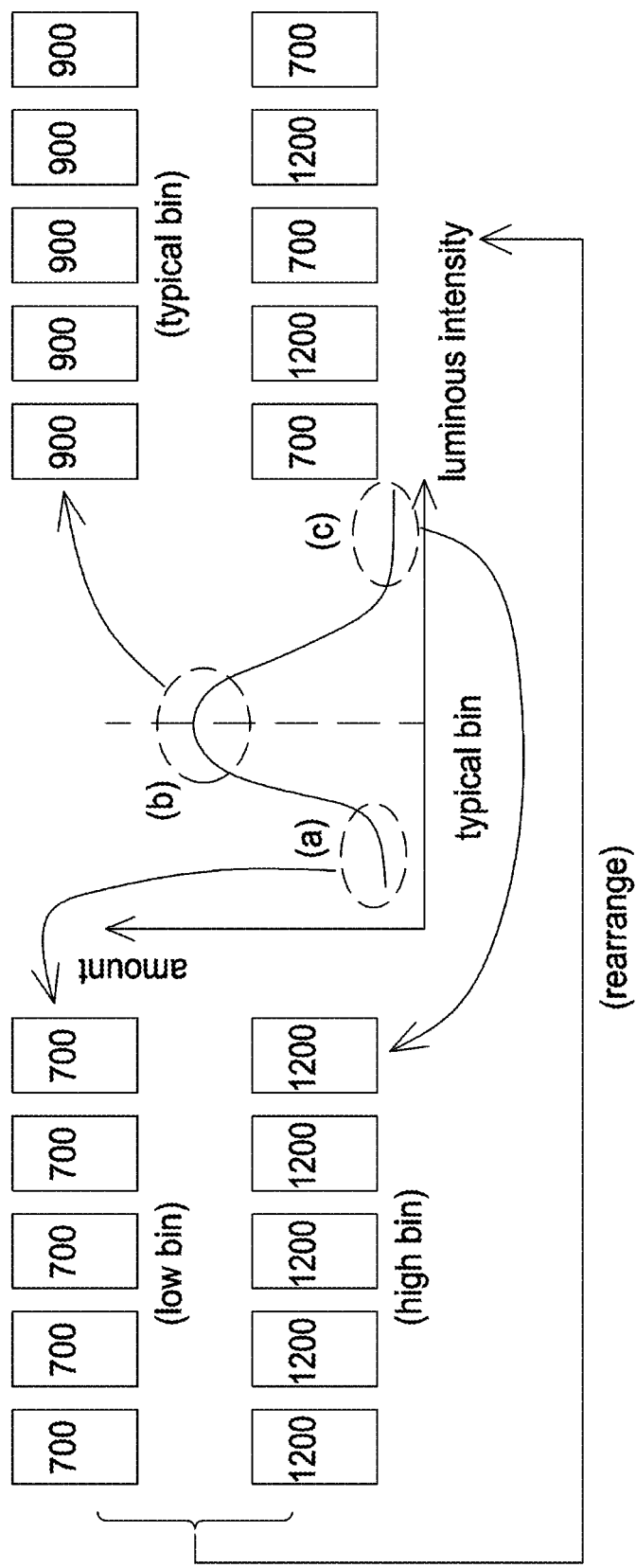
FIG. 4 shows a manufacturing method of a light-emitting device in accordance with the fifth embodiment of the present disclosure.

Although it is illustrated in the first embodiment that a plurality of regions on the substrate as shown in FIG. 1 may be determined based on difference in optical characteristics or electrical characteristics, and a plurality of blocks of semiconductor stack from these different regions are used to be bonded, this is not a limitation to the present application. FIG. 4 shows a fifth embodiment of the present disclosure. In this embodiment, the blocks of semiconductor stack are not able to be classified into different regions on the substrate as shown in FIG. 1 based on difference in optical characteristics or electrical characteristics. However, based on a measurement result of optical characteristics or electrical characteristics, these blocks of semiconductor stack on the same substrate are still able to be respectively classified into a typical bin group, a low bin group, and a high bin group, wherein the optical characteristic value or the electrical characteristic value in the high bin group is greater than that in the typical bin group, and the optical characteristic value or the electrical characteristic value in the typical bin group is greater than that in the low bin group. For example, FIG. 4 shows the measurement result of luminous intensity for these blocks of semiconductor stack on the same substrate. After the measurement, data for the location on the substrate and luminous intensity value for each block of semiconductor stack can be stored in a machine. The horizontal axis in the figure is the luminous intensity, and the vertical axis is an amount of blocks of semiconductor stack for the correspondent luminous intensity. As shown in the figure, group (a) is the low bin group which has an average luminous intensity of 700 mcd. Group (b) is the typical bin group which has an average luminous intensity of 900 mcd, and group (c) is the high bin group which has an average luminous intensity of 1200 mcd. By using the separating method illustrated in FIG. 2 and the bonding method illustrated in FIG. 3, and based on data for the location on the substrate and luminous intensity value for each block of semiconductor stack which are stored in the machine, proper blocks of semiconductor stack can be selected to be bonded on the permanent substrate 301 as shown in FIG. 3A, and rearrangement of blocks of semiconductor stack is achieved. As shown on the right part of FIG. 4, if a device is designed to have five blocks of semiconductor stack, then with the rearrangement, five blocks of semiconductor stack in the typical bin group (with an average luminous intensity of 900 mcd) are selected to be bonded on the permanent substrate 301 shown in FIG. 3A to form a device C. For another device D, three blocks of semiconductor stack in the low bin group (with an average luminous intensity of 700 mcd) are selected to be bonded on the permanent substrate 301 shown in FIG. 3A, and two blocks of semiconductor stack in the high bin group (with an average luminous intensity of 1200 mcd) are selected to be bonded on the same permanent substrate 301 to form the device D. The blocks of semiconductor stack on different location of the substrate may have great difference in optical characteristics or electrical characteristics. For example, there is relatively higher luminous intensity of 1200 mcd as those in the high bin group while there is relatively lower luminous intensity of 700 mcd as those in the low bin group. However, after the blocks of semiconductor stack are rearranged in the present embodiment, the uniformity between the devices is improved and controlled. For example, both the device C and the device D have luminous intensity of substantially 4500 mcd. In addition, as mentioned in the first embodiment, after being bonded to the permanent substrate 301, the blocks of semiconductor stack are located respectively on different non-coplanar surfaces. This reduces the mutual absorption of light between the blocks of semiconductor stack, and leads to a better performance on an overall luminous intensity.

It is noted that, in the above embodiments, the optical characteristic values or characteristic electrical values can be obtained by actually carrying out measuring all blocks of semiconductor stack or by sampling some of them before the separating process. In a case where the manufacturing process is stable, a predetermined statistic value for the optical characteristic values or characteristic electrical values can be obtained through statistics from a certain number of measuring. For example, a boundary of the first region and the second region in the FIG. 1 can be checked through statistics from a certain number of measuring in a case where the manufacturing process is stable. That is, a predetermined value for a radius of the first region, and the correspondent optical characteristic values or correspondent characteristic electrical values in this case are obtained, and actual one by one measuring for all output substrates are not necessary.

Figure 5A:
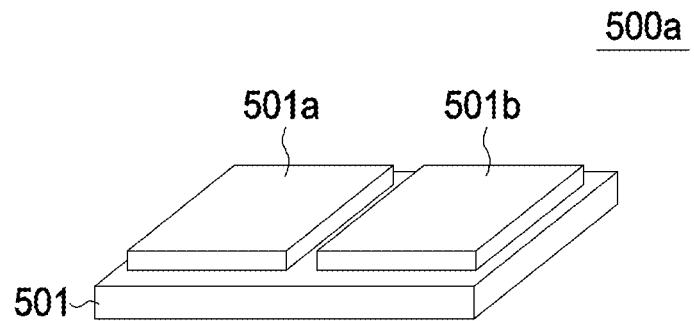
FIGS. 5A to 5C show a manufacturing method of a light-emitting device in accordance with the sixth embodiment of the present disclosure.

As mentioned in FIG. 3E for the first embodiment, the blocks of semiconductor stack bonded to the permanent substrate 301 can be from different semiconductor stacks. For example, the block of semiconductor stack on the first surface 301P1 and the block of semiconductor stack on the second surface 301P2 can be from different semiconductor stacks from different substrates. This kind of application can further be used to improve the color rendering of a light-emitting device, that is, to raise the CRI value of a light-emitting device. This kind of application is shown as FIGS. 5A to 5C, which is the sixth embodiment of the present disclosure. As shown in FIG. 5A, blocks of semiconductor stack 501a and 501b are respectively bonded to the permanent substrate 501, wherein the bonding method is substantially as illustrated in the first embodiment shown in FIG. 3. However, the two blocks of semiconductor stack 501a and 501b are separated from different semiconductor stacks from different substrates. For example, the block of semiconductor stack 501a is separated from a semiconductor stack which can emit light with a dominant wavelength of about 620 nm to 645 nm, while the block of semiconductor stack 501b is separated from a semiconductor stack which can emit light with a dominant wavelength of about 595 nm to 620 nm. That is, the two blocks of semiconductor stack 501a and 501b are separated from different substrates, and the block of semiconductor stack 501a can emit light with a red color, while the block of semiconductor stack 501b can emit light with an orange color. Thus, when the two blocks of semiconductor stack are bonded to the permanent substrate 501, a light-emitting device 500a is formed, which can be used to replace a chip which includes only a single semiconductor stack for the red or orange light in a conventional warm white light-emitting device. That is, the light-emitting device 500a can be used in combination with a blue light source and YAG. Because the warm white light from this combination includes light with different dominant wavelengths from the two blocks of semiconductor stack 501a and 501b, it has a better color rendering in comparison with warm white light formed by the above chip which includes only a single semiconductor stack.

Figure 5B:
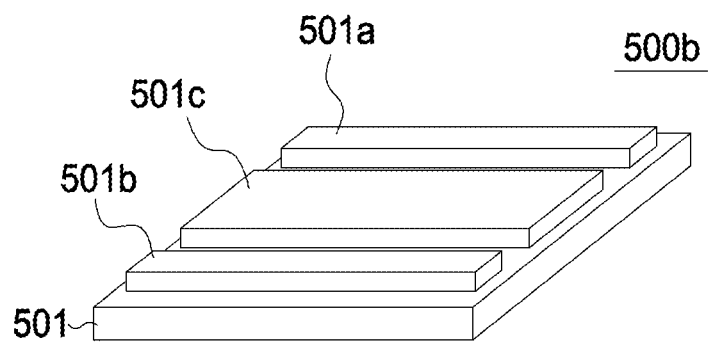

As shown in FIG. 5B, in addition to the two blocks of semiconductor stack 501a and 501b bonded to the permanent substrate 501, a block of semiconductor stack 501c to provide blue light is also directly bonded to the permanent substrate 501. A light-emitting device 500b is formed directly as a warm white light source, wherein the three blocks of semiconductor stack 501a, 501b, and 501c are separated from different semiconductor stacks from different substrates. For example, the block of semiconductor stack 501a is separated from a semiconductor stack which can emit light with a dominant wavelength of about 620 to 645 nm. The block of semiconductor stack 501b is separated from a semiconductor stack which can emit light with a dominant wavelength of about 595 nm to 620 nm. The block of semiconductor stack 501c is separated from a semiconductor stack which can emit light with a dominant wavelength of about 440 nm to 460 nm. That is, the three blocks of semiconductor stack 501a, 501b, and 501c are separated from different substrates, and the block of semiconductor stack 501a can emit light with a red color, the block of semiconductor stack 501b can emit light with an orange color, and the block of semiconductor stack 501c can emit light with a blue color.

Figure 5C:
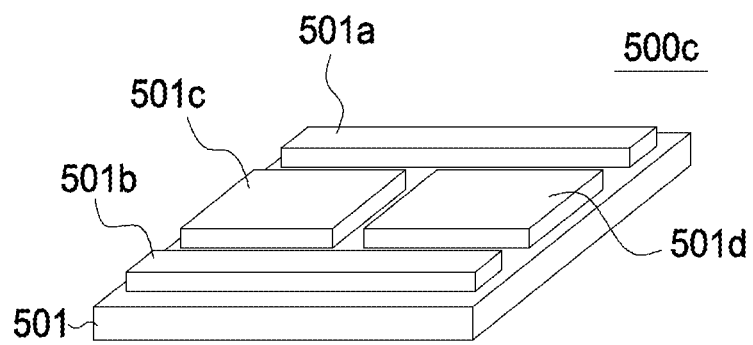

Further, as shown in FIG. 5C, in addition to the three blocks of semiconductor stack 501a, 501b, and 501c bonded to the permanent substrate 501, a fourth block of semiconductor stack 501d is further bonded to the permanent substrate 501. The four blocks of semiconductor stack 501a, 501b, 501c, and 501d are separated from different semiconductor stacks from different substrates. The dominant wavelengths and colors of light emitted by blocks of semiconductor stack 501a, 501b, and 501c are the same as those illustrated in FIG. 5B above, and the block of semiconductor stack 501d can emit light with a dominant wavelength of about 510 nm to 530 nm, i.e., a green color. Because the block of semiconductor stack 501d emits light with a dominant wavelength in a green color, the warm white light from this light-emitting device 500c has a higher CRI value than that of the light-emitting device 500b in FIG. 5B. That is, the color rendering of the light-emitting device 500c is even better.

The above-mentioned embodiments are only examples to illustrate the theory of the present invention and its effect, rather than be used to limit the present application. Other alternatives and modifications may be made by a person having ordinary skill in the art of the present application without departing from the spirit and scope of the application, and are within the scope of the present application.

What is claimed is:

1. A light-emitting device, comprising:
   a substrate with a topmost surface;
   a first semiconductor stack arranged on the substrate, and comprising a first light-emitting layer separated from the topmost surface by a first distance;
   a first bonding layer arranged between the substrate and the first semiconductor stack;
   a second semiconductor stack arranged on the substrate, and comprising a second light-emitting layer separated from the topmost surface by a second distance;
   a second bonding layer arranged between the substrate and the second semiconductor stack;
   a third semiconductor stack arranged on the substrate, and comprising third light-emitting layer separated from the topmost surface by a third distance; and
   a third bonding layer arranged between the substrate and the third semiconductor stack,
   wherein the first semiconductor stack, the second semiconductor stack, and the third semiconductor stack are configured to emit different color lights;
   wherein the second distance is different form the first distance and the third distance,
   wherein the third bonding layer and the second bonding layer have different thicknesses.

2. The light-emitting device of claim 1, wherein the first semiconductor stack, the second semiconductor stack and the third semiconductor stack are configured to emit red light, green light and blue light, respectively.

3. The light-emitting device of claim 1, wherein the first semiconductor stack and the third semiconductor stack are made of same materials system.

4. The light-emitting device of claim 1, further comprising a dielectric layer formed on the first semiconductor stack, the second semiconductor stack and the third semiconductor stack.

5. The light-emitting device of claim 1, wherein the first semiconductor stack, the second semiconductor stack and the third semiconductor stack are electrically connected with one another.

6. The light-emitting device of claim 1, wherein the first semiconductor stack, the second semiconductor stack and the third semiconductor stack are electrically connected in parallel with one another.

7. The light-emitting device of claim 1, wherein the first bonding layer and the second bonding layer have different thicknesses.

8. The light-emitting device of claim 1, wherein the first semiconductor stack and the second semiconductor stack are not coplanar with each other with their uppermost surfaces.

9. The light-emitting device of claim 8, wherein the first semiconductor and the third semiconductor stack are coplanar with each other with their uppermost surfaces.

10. The light-emitting device of claim 2, further comprising a fourth semiconductor stack arranged on the substrate, and configured to emit a color light different from that emitted by any of the light emitted from the first semiconductor stack, the second semiconductor stack and the third semiconductor stack.

11. The light-emitting device of claim 10, wherein the color light emitted from the fourth semiconductor stack is orange light.

* * * * *